(12) United States Patent
Tung

(10) Patent No.: US 6,277,675 B1
(45) Date of Patent: Aug. 21, 2001

(54) METHOD OF FABRICATING HIGH VOLTAGE MOS DEVICE

(75) Inventor: Ming-Tsung Tung, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/429,150

(22) Filed: Oct. 28, 1999

(51) Int. Cl.[7] .................................................. H01L 21/332
(52) U.S. Cl. ............................ 438/138; 438/270; 438/443
(58) Field of Search ................................... 438/138, 268, 438/270, 286, 443

(56) References Cited

U.S. PATENT DOCUMENTS 5,770,880 * 6/1998 Woodbury et al. .................. 438/286
5,970,343 * 10/1999 Kocon .................................. 438/138
6,037,229 * 3/2000 Lee ...................................... 438/443

* cited by examiner

Primary Examiner—Chandra Chaudhari
(74) Attorney, Agent, or Firm—Thomas, Kayden, Horstemeyer & Risley, LLP

(57) ABSTRACT

A method for fabricating a high voltage MOS device. A substrate has a first P-type well region and a N-type well region formed thereon. A field oxide is then formed on the N-well region and patterned until field oxide projections project from the field oxide layer. With the field oxide projections serving as masks, second P-type well regions are formed in both P-type and N-type lightly doped well regions. A gate oxide layer and a gate polysilicon layer are formed in sequence on a part of the substrate and the field oxide projection, wherein the gate oxide layer and the gate polysilicon layer form a gate electrode. With the gate electrode and the field oxide layer serving masks, a source/drain region is consequently formed in the first P-type well region and the N-type well region.

18 Claims, 2 Drawing Sheets

METHOD OF FABRICATING HIGH VOLTAGE MOS DEVICE

BACKGROUND OF THE INVENTION

1. Field of Invention

The present invention relates to a fabrication method for an integrated circuit. More particularly, the present invention relates to a method for fabricating a high voltage (HV) MOS device.

2. Description of Related Art

A technique for fabricating HV MOS devices is described in the article entitled "High Voltage Thin layer Devices (RESURF Devices)," IEDM Proceedings, 1979, pp 238–241. This technique uses a shallow lightly doped region between the drain and channel regions of the device. This shallow lightly doped region is referred to as a drift region because of the low amount of current carriers that are available due to the low level of impurity doping, while the device is known as a Reduced Surface Field, RESURF, device.

RESURF techniques are utilized in manufacturing high voltage N-channel Lateral Double Diffused MOS, LDMOS, devices and high voltage, P-channel LDMOS, devices. However, problems exist in the manufacture of such RESURF LDMOS devices.

FIG. 1 is a schematic, cross-sectional diagram illustrating a conventional LDMOS structure.

Referring to FIG. 1, a p-type substrate 100 is provided with a field oxide layer 102 formed on the surface thereof, wherein the field oxide layer 102 serves to increase the channel length between a N-type source region 104 and a N-type drain region 106. A N-type lightly doped region 108 which serves as a drift region for carriers after voltage application to the device is formed below the field oxide layer 102 in the substrate 100. A P-type lightly doped region 112 is formed below a gate electrode 110 and surrounding the N-type source region 104 to increase the internal electric field of the device. As a result, the trans conductance of the device is improved under this circumstance. However, a denser distribution of electric line with larger curvature is produced below a channel region 114 and around the edge of the drift region 108 to result in a potential crowding when the device is operated at a high voltage. The depletion region formed by the drift region 108 is not sufficient to lessen the distribution of the electric line produced by high voltage; thus the increased electric field causes an electrical breakdown adjacent to the channel region of the device instead of in a bulk region. The bulk region is indicated as a part of the substrate 100 at the drain end of the device.

Conventionally, the problem of electrical breakdown is solved by reducing the doping concentration of the drift region 108 as a way to increase the size of the depletion region, while such size increase of the depletion region results in an increase in breakdown voltage. However, the current driving performance of the device is decreased when the concentration in the drift region 108 is decreased, while the electrical breakdown rarely occurs in the bulk region. Furthermore, since the channel length 114 cannot be precisely controlled using the gate electrode 110 that serves as a mask, it is difficult to increase the electric field strength, which in turn affects the conductance of the device.

SUMMARY OF THE INVENTION

The invention provides a fabrication method for a high voltage MOS device, which method includes providing a substrate with a first P-type well region and a N-type type well region formed thereon. A field oxide is then formed on the N-well region and patterned until field oxide projections project from the field oxide layer. With the field oxide projections serving as masks, second P-type well regions are formed in both P-type and N-type lightly doped well regions. A patterned gate oxide layer and a gate polysilicon layer are formed in sequence to cover a part of the field oxide layer and the field oxide projection, wherein the gate oxide layer and the gate polysilicon layer form a to gate electrode. With the gate electrode and the field oxide layer serving as masks, a source/drain region is consequently formed in the first P-type well region and the N-type well region, respectively.

As embodied and broadly described herein, the invention provides a HV MOS device comprising a first P-well region, a N-well region, and a second P-well region, wherein the second P-well region has a higher doping concentration than the first P-well region and the N-well region. Therefore, the second P-well region can increase the conductance in the device due to its high doping concentration. In addition, the N-well region has a higher doping concentration in comparison with the conventional drift region, so the electrical breakdown occurs more readily in the bulk region rather than in the channel region. This implies that a higher voltage can be applied to the device without causing the electrical breakdown that would damage the device. Furthermore, the threshold voltage applied to the device can be adjusted through the first P-well due to a difference in doping concentrations of the first P-well and the second P-well.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A through 2E are schematic, cross-sectional views illustrating steps for fabricating a high voltage (HV) MOS device according to one preferred embodiment of this invention.

Figure 1:
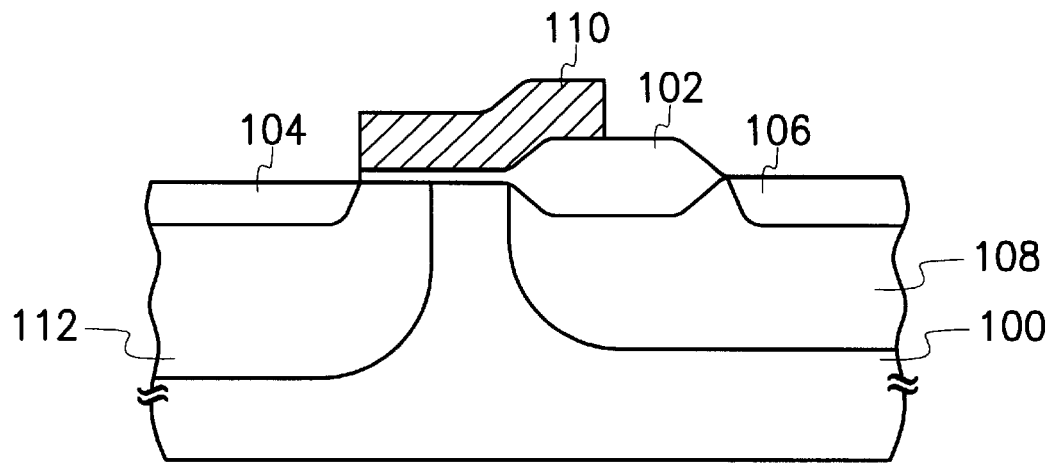
FIG. 1 is a schematic, cross-sectional diagram illustrating a conventional LDMOS structure.
Figure 2A:
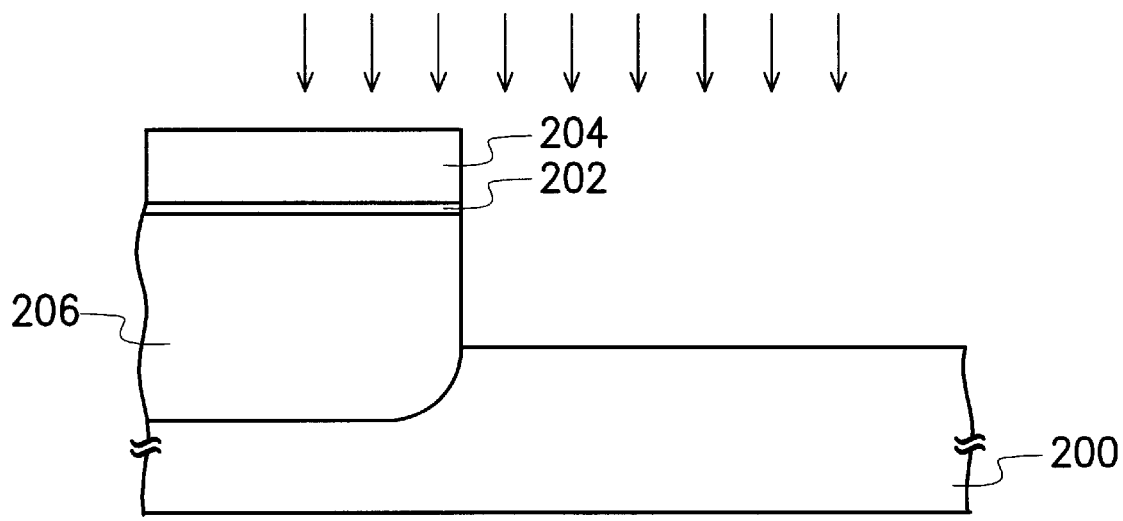
FIGS. 2A through 2E are schematic, cross-sectional views illustrating steps for fabricating a high voltage MOS device according to one preferred embodiment of this invention.

Referring to FIG. 2A, a substrate 200 such as a P-type substrate is provided with a pad oxide layer 202 formed thereon, wherein the pad oxide layer may be formed by thermal oxidation. An ion implantation, such as shallow blanket implantation is performed as indicated by arrows in the diagram for forming a first P-well region 206. A nitride layer 204, preferably silicon nitride layer is formed on the pad oxide layer 202, while the nitride layer 204 is patterned so as to expose the pad oxide layer 202 on the defined region of the substrate 200 for subsequently forming a N-well. With the nitride layer 204 serving as an etching mask, the exposed pad oxide layer 202 and a portion of the substrate 200 underneath the pad oxide layer 202 are removed to expose the defined region of the substrate 200.

Figure 2B:
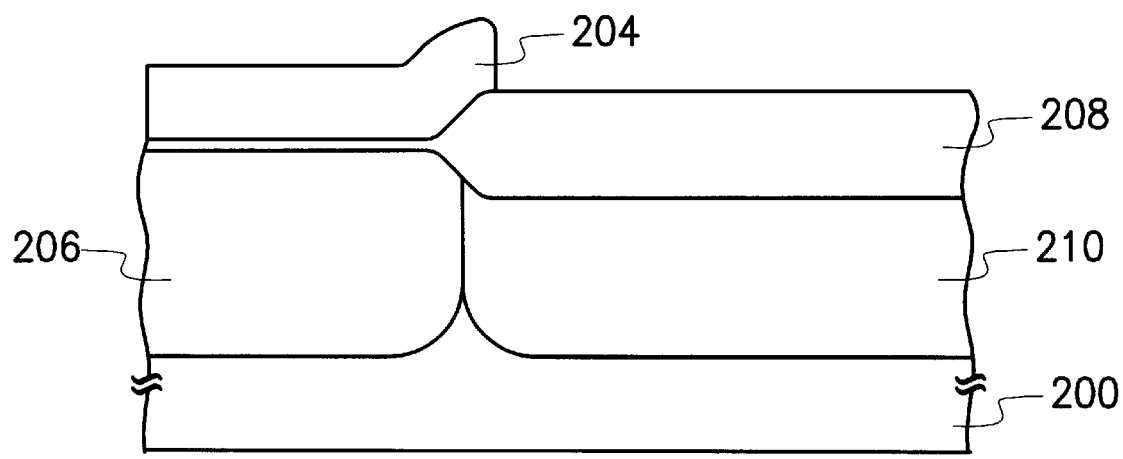

Referring to FIG. 2B, a sacrificial layer (not shown) is formed on the exposed substrate 200 before performing another ion implantation step, wherein the sacrificial layer includes an oxide layer. The ion implantation step is performed to form the N-well region 210 adjacent to the first P-well region 206, followed by performing a drive-in process, which causes dopants to be evenly distributed in the P-well region 206 and the N-well 210. Thus, the doping concentrations in the first P-well region 206 and N-well region 210 are uniform, wherein both the first P-well region 206 and N-well region 210 have a preferred doping concentration of about $1 \times 10^{15} - 1 \times 10^{16}$ atoms/cm$^3$. Since the N-well region 210 is formed in this case in a self-aligning fashion as described above, a channel region (not shown) of the HV MOS device according to the present invention can be precisely controlled. As a result, the drain/source on resistance ($R_{dson}$) of the device is also controlled. A field oxide layer 208 is formed on the exposed substrate 200 and covers a part of the pad oxide layer 202 (FIG. 2A), wherein the field oxide layer 208 resembles a bird's beak. The method for forming the field oxide layer 208 includes a process such as thermal oxidation.

Figure 2C:
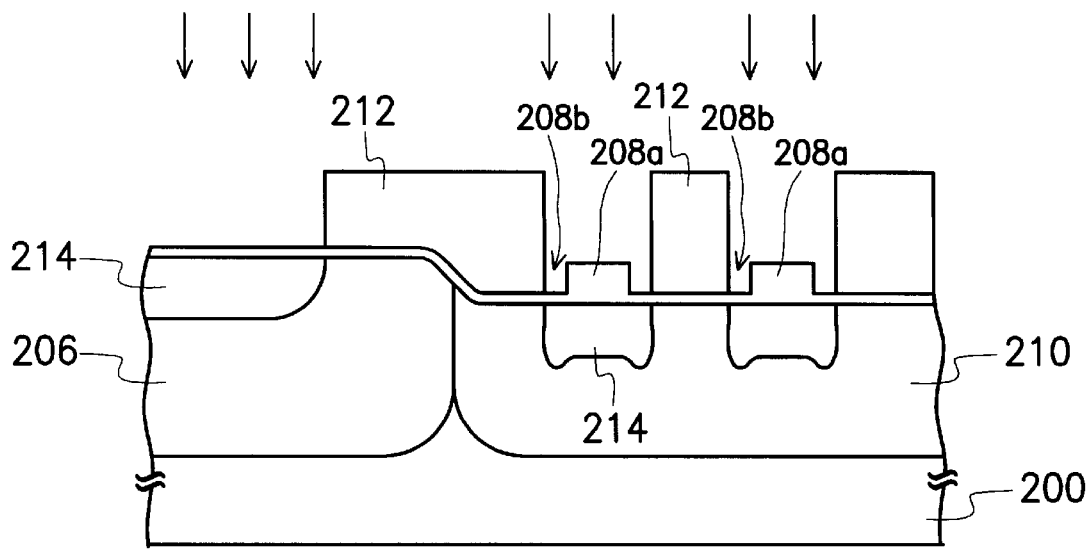

Referring to FIG. 2C, the nitride layer 204 is removed to expose the pad oxide layer 202 (FIG. 2A). The field oxide layer 208 is then patterned such that field oxide projections 208a project from the field oxide layer 208. The method for patterning the field oxide layer 208 includes a drift lithography step and an etching step. According to FIG, 2C, the second P-well regions 214 are formed in the P-well region 206 and the N-well region 210, wherein formation of the second P-wells 214 includes lithography and ion implantation. A patterned photoresist layer 212 is formed on regions of the field oxide layer 208 such that a small gap of the field oxide layer 208b exists between the patterned photoresist layer 212 and the field oxide projections 208a. As a result, dopants involved in the ion implantation step are only allowed to pass through the field oxide projections 208a and the field oxide gap 208b, inclusively. An annealing step is performed so that dopants are evenly distributed in the second P-well regions 214 to produce a uniform doping concentration, wherein the second P-well region 214 has a preferred doping concentration of about $1 \times 10^{16} - 3 \times 10^{17}$ atoms/cm$^3$.

The second p-well region 214 in this case may serve to increase the size of the depletion region below the field oxide layer 208. According to a known equation of electric field=voltage/length, it was known that electric field strength is reduced as a result of increasing the size of the depletion region when a high voltage is applied to the device. In addition, the N-well region 210 has a higher doping concentration in comparison with the conventional drift region 108, so the electrical breakdown occurs more readily in the bulk region rather than in the channel region. This implies that a higher voltage can be applied to the device without causing the electrical breakdown that would damage the device. However, the second P-well region 214 in this case also serves the purpose of increasing the conductance in the device due to the high doping concentration of the second P-well region 214.

Figure 2D:
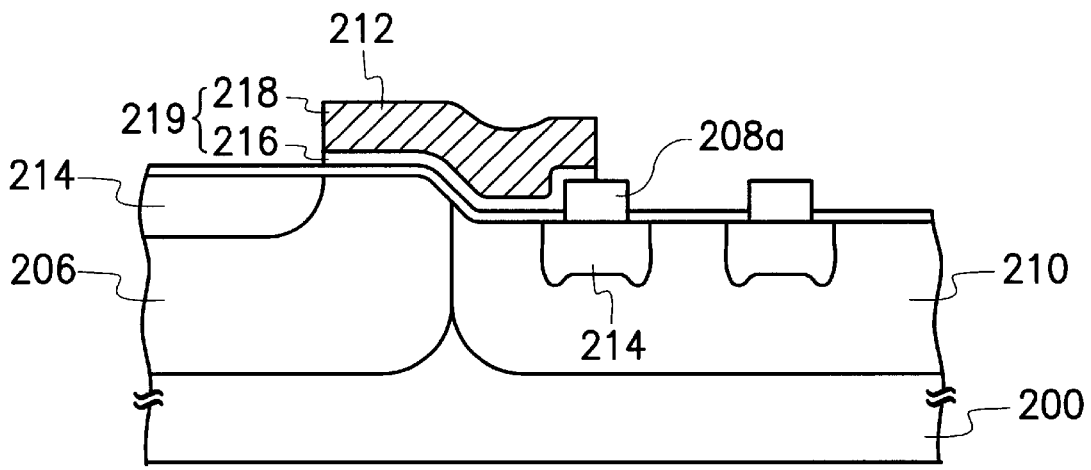
Figure 2E:
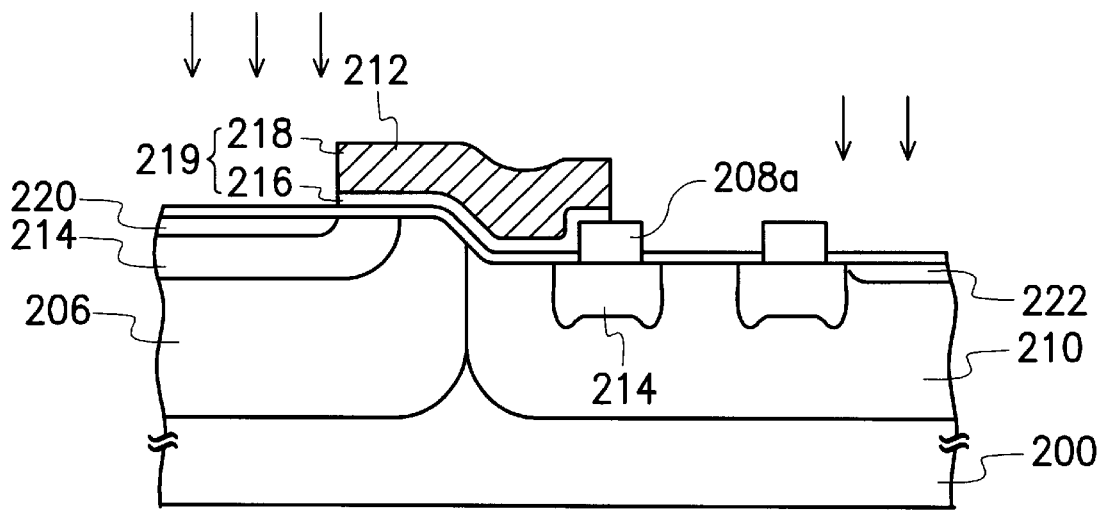

Referring to FIG. 2D, a patterned gate oxide layer 216 and a gate polysilicon layer 218 are formed in sequence to cover a part of the field oxide layer 208 and the field oxide projection 208a. The gate oxide layer 216 and the gate polysilicon layer 218 in this case form a gate electrode 219.

Referring to FIG, 2E, another ion implantation step is further performed to form a source region 220 and a drain region 222 in the second P-well region 214 and the N-well region 210, respectively, with the gate electrode 219 and the field oxide projections 208a serving as masks. Both the source region 220 and the drain region 222 in this case have a N-type conductivity.

Summarizing above, it is understood that the invention has the following advantages. In the invention, the n-well region is formed in a self-aligning fashion as described above, so the channel length of the HV MOS device according to the present invention can be precisely controlled. As a result, the $R_{dson}$ of the device is also controlled. According to the invention, a HV MOS device comprising a first P-well region, a N-well region, and a second P-well region is provided, wherein the second P-well region has a higher doping concentration than the first P-well region and the N-well region. Therefore, the second P-well region can increases the conductance in the device due to its high doping concentration. In addition, the N-well region has a higher doping concentration in comparison with the conventional drift region, so the electrical breakdown occurs more readily in the bulk region rather than in the channel region. This implies that a higher voltage can be applied to the device without causing the electrical breakdown that would damage the device. As a difference in doping concentration exists between the first P-well and the second P-well, the threshold voltage applied to the device can be adjusted through the first P-well.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for an integrated circuit (IC) device, the method comprising steps of:

providing a substrate with a first oxide layer formed thereon;

performing a first ion implantation step for forming a first lightly doped region;

forming a protective layer on the first oxide layer;

patterning the protective layer so that a portion of the protective layer remains to cover the first oxide layer on the first lightly doped region;

removing a part of the first oxide layer and a portion of the substrate doped with ions, with the remaining protective layer serving as a mask, so that a part of the substrate is exposed;

forming a sacrificial layer on the exposed part of the substrate;

performing a second ion implantation step for forming a second lightly doped region in a part of the substrate below the sacrificial layer;

performing a drive-in step so as to produce uniform doping concentrations in the first lightly doped region and the second lightly doped region, respectively;

removing the sacrificial layer until the second lightly doped region is exposed;

forming a second oxide layer on the second lightly doped region;

removing the protective layer;

patterning the second oxide layer so that a field oxide projection projects from the second oxide layer on the second lightly doped region;

forming a patterned photoresist layer on both the first and second oxide layers;

performing a third ion implantation step for forming third lightly doped regions, with the patterned photoresist layer and the field oxide projection serving as masks;

performing an annealing step so as to produce a uniform doping concentration in the third lightly doped region;

forming a patterned gate oxide layer and gate polysilicon layer in sequence to cover a part of the oxide layer and the field oxide projection;

forming a source/drain region in the third lightly doped region and the second lightly doped region, respectively, with the gate structure and the field oxide projection serving as masks so as to complete manufacture of the IC device.

2. The fabrication method of claim 1, wherein the first ion implantation step includes shallow blanket implantation.

3. The fabrication method of claim 1, wherein the protective layer includes a silicon nitride layer.

4. The fabrication method of claim 1, wherein the sacrificial layer includes a silicon oxide layer.

5. The fabrication method of claim 1, wherein the doping concentration in the third lightly doped region is higher than the doping concentrations of the first lightly doped region and the second lightly doped region.

6. The fabrication method of claim 5, wherein the doping concentration of the third lightly doped region is about $1\times10^{16}$–$3\times10^{17}$ atoms/cm$^3$.

7. The fabrication method of claim 5, wherein the doping concentration of the first lightly doped region and the second lightly doped region is about $1\times10^{15}$–$1\times10^{16}$ atoms/cm$^3$.

8. The fabrication method of claim 1, wherein the first lightly doped region has a first dopant type.

9. The fabrication method of claim 8, wherein the second lightly doped region has a second dopant type.

10. The fabrication method of claim 9, wherein the third lightly doped region has a third dopant type.

11. The fabrication method according to claim 10, wherein the first dopant type is the same as the third dopant type, while the first dopant type is different from the second dopant type.

12. The fabrication method of claim 1, wherein the oxide layer is formed by thermal oxidation.

13. A fabrication method for a high voltage (HV) MOS device, the method comprising steps of:

providing a substrate with a pad oxide layer formed thereon;

performing a shallow blanket implantation step for forming a first p-well region;

forming a silicon nitride layer on the pad oxide layer;

patterning the silicon nitride layer so that a portion of the silicon nitride layer remains to cover the pad oxide layer on the first P-well region;

removing a part of the pad oxide layer and a portion of the substrate doped with ions, with the remaining silicon nitride layer serving as a mask, so that a part of the substrate is exposed;

forming a sacrificial layer on the exposed part of the substrate;

performing an ion implantation step for forming a N-well region in a part of the substrate below the sacrificial layer;

performing a drive-in step so as to produce uniform doping concentrations in the first P-well region and the N-well region, respectively;

removing the sacrificial layer until the N-well region is exposed;

forming a field oxide layer on the N-well region;

removing the silicon nitride layer;

patterning the field oxide layer so that field oxide projections project from the field oxide layer on the N-well region;

forming a patterned photoresist layer on the field oxide layer;

performing another ion implantation step for forming second P-well regions, with the patterned photoresist layer and the field oxide projections serving as masks;

performing an annealing step so as to produce a uniform doping concentration in the second P-well region;

forming a patterned gate oxide layer and gate polysilicon layer in sequence to cover a part of the pad oxide layer, the field oxide layer, and the field oxide projection;

forming a N-type source/drain region in the first P-well region and the N-well region, respectively, with the gate structure and the field oxide projections serving as masks, so as to complete manufacture of the HV MOS device.

14. The fabrication method of claim 13, wherein the sacrificial layer includes a silicon oxide layer.

15. The fabrication method of claim 13, wherein the doping concentration in the second P-well region is higher than the doping concentrations of the first P-well region and the N-well region.

16. The fabrication method of claim 15, wherein the doping concentration of the second P-well region is about $1\times10^{16}$–$3\times10^{17}$ atoms/cm$^3$.

17. The fabrication method of claim 15, wherein the doping concentration of the first P-well region and the N-well region is about $1\times10^{15}$–$1\times10^{16}$ atoms/cm$^3$.

18. The fabrication method of claim 13, wherein the field oxide layer is formed by thermal oxidation.

* * * * *